United States Patent [19]
Kyles et al.

[11] Patent Number: 6,008,680
[45] Date of Patent: Dec. 28, 1999

[54] CONTINUOUSLY ADJUSTABLE DELAY-LOCKED LOOP

[75] Inventors: Ian Kyles, West Linn, Oreg.;
Jean-Marc Patenaude, Sunnyvalle, Calif.

[73] Assignee: LSI Logic Corporation, Milpitas, Calif.

[21] Appl. No.: 08/919,248

[22] Filed: Aug. 27, 1997

[51] Int. Cl.$^6$ .................................................. H03K 5/13
[52] U.S. Cl. ............................. 327/277; 327/284; 327/99
[58] Field of Search ................................. 327/276, 277, 327/278, 284, 285, 288, 270, 99, 407

[56] References Cited

U.S. PATENT DOCUMENTS

| | | | |
|---|---|---|---|
| 4,965,535 | 10/1990 | Neuman | 331/116 FE |
| 5,142,249 | 8/1992 | Hirotomi | 331/57 |
| 5,175,512 | 12/1992 | Self | 331/57 |
| 5,208,557 | 5/1993 | Kersh, III | 331/57 |
| 5,272,453 | 12/1993 | Traynor et al. | 331/57 |
| 5,349,311 | 9/1994 | Mentzer | 331/57 |
| 5,416,446 | 5/1995 | Holler et al. | 331/57 |
| 5,446,417 | 8/1995 | Korhonen et al. | 331/57 |
| 5,477,198 | 12/1995 | Anderson et al. | 331/177 R |
| 5,563,553 | 10/1996 | Jackson | 331/57 |
| 5,629,652 | 5/1997 | Weiss | 331/108 B |
| 5,686,867 | 11/1997 | Sutardja | 331/57 |
| 5,719,514 | 2/1998 | Sato | 327/262 |
| 5,729,158 | 3/1998 | Rajivan et al. | 327/276 |
| 5,781,056 | 7/1998 | Fujii | 327/276 |

*Primary Examiner*—Timothy P. Callahan
*Assistant Examiner*—Eunja Shin

[57] ABSTRACT

A circuit and method are shown for a continuously adjustable delay circuit. The present invention utilizes two signal delay paths controlled by a tuning signal wherein each delay path receives a reference signal. The first delay path delays the reference signal in response to the tuning signal in a manner that is complementary to the manner in which the second delay path delays the reference signal in response to the tuning signal. By selecting one of the signal output by the first delay path and the signal output by the second delay path and switching between the two signals at a point when the two signals are separated by a period of the reference signal, a delay of the reference signal can be continuously adjusted.

12 Claims, 10 Drawing Sheets

CONTINUOUSLY ADJUSTABLE DELAY-LOCKED LOOP

FIELD OF THE INVENTION

The present invention relates generally to the provision of a clocking signal in a communications transceiver.

BACKGROUND OF THE INVENTION

Digital data are often transferred across computer and telecommunications networks. A clock signal is required to synchronize both the transmission and reception of digital data in a communications device used to transfer the data. The clock signal is used by a transmitter to drive digital data onto a communications medium at a set frequency. The clock signal is used by a receiver to recover the transmitted data from the communications medium and drive the circuits which receive the data from the receiver.

Clock signals having high precision are desirable in order to transmit and receive without losing data. A precise transmit clock aids in the efficient and loss-free reception of the transmitted data because the data transmitted using the clock has a predictable transfer frequency with consistent data transition edge positions. Data transmitted using a transmit clock having jitter, i.e. random or systematic variation in an edge position relative to an ideal edge, or that is out-of-tolerance, i.e. the fundamental frequency of the data signal deviates from the ideal frequency, must be compensated for in the receiver and, if the receiver is unable to compensate then data can be lost. Thus, receivers require precise clocks that allow the receiver to compensate for variations in the phase and frequency of the incoming data signal or stream.

A typical device used to generate a precise clock frequency is Phase-Locked Loop (PLL). Transmitters use a PLL to synthesize a high frequency transmit clock from a lower frequency reference clock because of the difficulty in distributing the high frequency clock in the presence of noise and because of the higher power consumption of a higher speed clock. Receivers use a separate PLL to accommodate differences in the phase and frequency of the incoming data relative to a reference clock frequency. Each channel for transmission or reception therefore typically requires its own PLL along with the attendant pin-out, power and circuit area requirements. As a result, integrated circuits (ICs) which use multiple serial transmitters and receivers may become too large because of the separate PLLs required to create the local clock for each channel. Also, multiple PLLs on a single chip can interfere with one another and degrade their performance.

Figure 1:
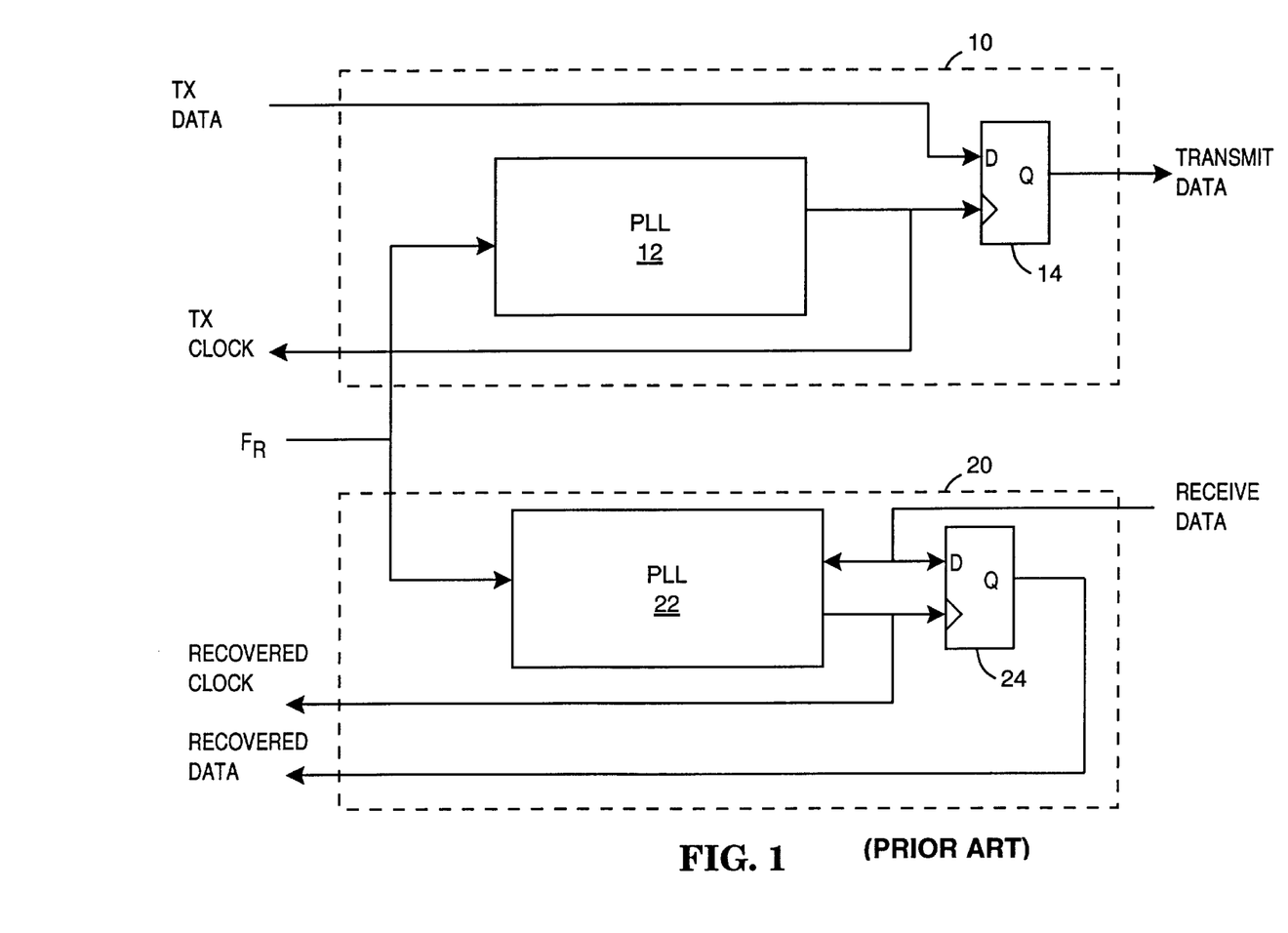
FIG. 1 is a block diagram of an embodiment of a prior art transmitter and receiver pair.

A conventional transmit and receive pair of the prior art is shown in FIG. 1. A transmitter 10 includes a PLL 12 which receives a reference frequency $F_R$ and generates a transmit clock TX CLOCK which drives the transmit data TX DATA through D flip-flop 14 onto the transmission medium as TRANSMIT DATA. TX CLOCK is also routed back to the circuit sending TX DATA to synchronize the transfer of TX DATA into transmitter 10.

A receiver 20 also includes a PLL 22 which receives the reference frequency $F_R$ and the received data RECEIVE DATA which has been transmitted by a device similar to transmitter 10. PLL 22 adjusts its phase responsive to RECEIVE DATA in order to recover the receive clock RECOVERED CLOCK which drives D flip-flop 24 to recover the receive data RECOVERED DATA from the RECEIVE DATA signal from the transmission medium. RECOVERED CLOCK is also routed to the circuit which receives the RECOVERED DATA signal in order to synchronize the transfer of RECOVERED DATA signal from receiver 20.

In the PLL 22 in receiver 20, while the reference frequency $F_R$ controls the fundamental frequency of PLL 22, the data transitions in the RECEIVE DATA signal adjust the phase of the RECOVERED CLOCK signal generated by the PLL 22 so that the edges of RECOVERED CLOCK signal are in synchronization with the transitions of the data in RECEIVE DATA signal.

Figure 2:
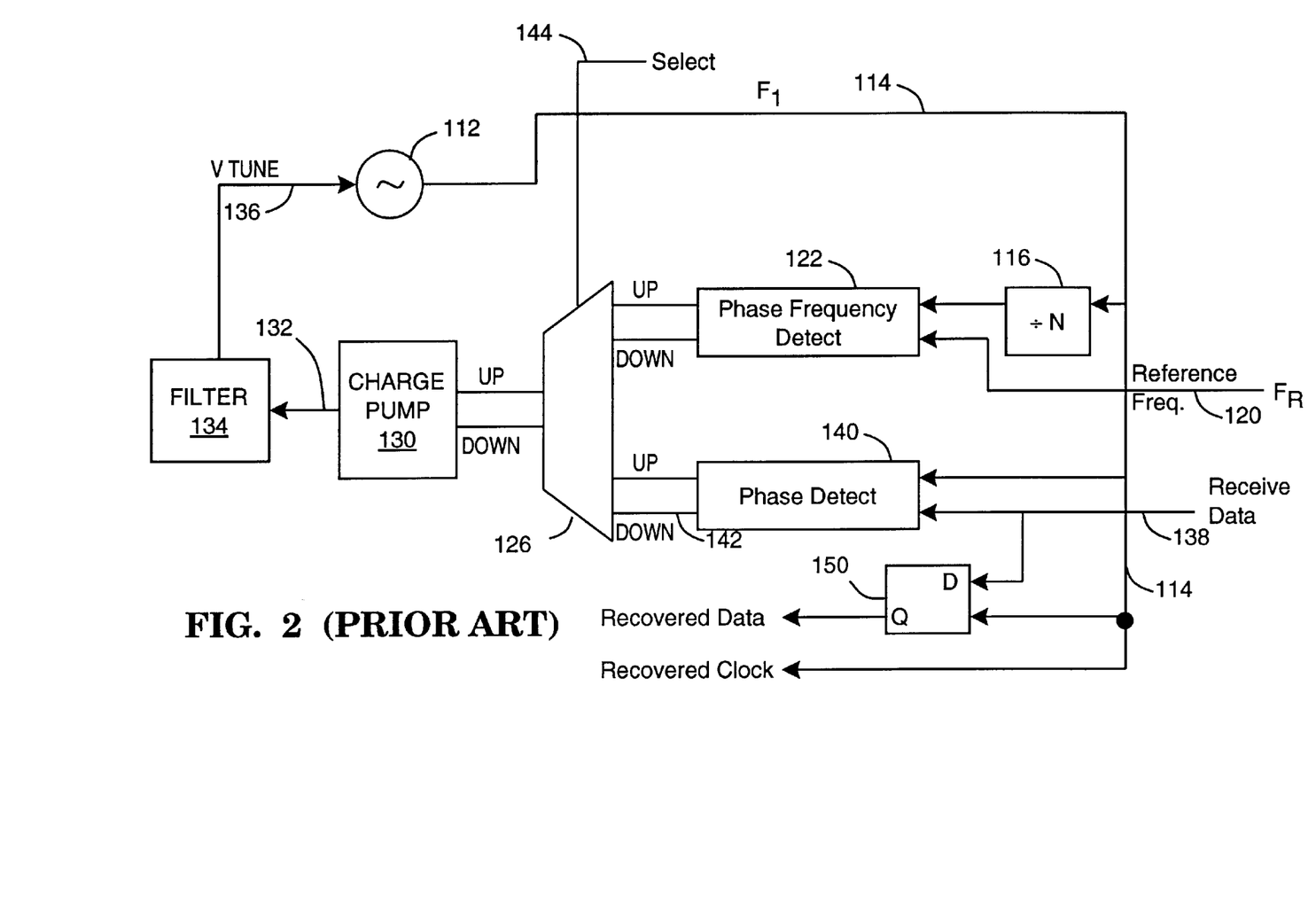
FIG. 2 is a schematic drawing of a receiver circuit according to the prior art.

FIG. 2 illustrates another embodiment, according to the prior art, of a serial receiver clock and data recovery circuit. A phase-locked loop circuit comprises a voltage controlled oscillator (VCO) 112 to provide a clock signal at line 114. The clock signal from the VCO is input to a divide-by-N circuit 116 to divide it down to a predetermined reference frequency. A reference frequency source $F_R$ (i.e. a reference clock signal) is input at line 120 and compared to the divide-by-N clock signal in a phase-frequency detector circuit 122. If the divided clock frequency is lower than the reference frequency $F_R$, the detector 122 asserts the "up" signal through multiplexor 126 to cause a charge pump 130 to increase a tune voltage for controlling the VCO 112. The charge pump output at line 132, typically an analog voltage, is input to a filter 134 and the filtered tuning voltage "VTune" is input to the VCO at line 136 to increase the clock frequency $F_1$ in an effort to match it to N times the reference frequency $F_R$.

Conversely, if and when the detector 122 determines that the clock frequency f/N is greater than the reference frequency $F_R$ at 120, it asserts a down "DOWN" signal through MUX 126 to the charge pump 130 in order to lower the tune voltage and thereby lower the frequency output by the oscillator 112. In this manner, the VCO 112, divide-by-N 116, detector 122, charge pump 130 and filter 134 form a closed loop (i.e. a phase-locked loop) for dynamically adjusting the VCO frequency in order to hold it to N times the reference frequency $F_R$. However, merely matching the frequency of a serial data stream is insufficient to accurately recover the data. The precise phase of the data stream must be taken into account as well. To illustrate, imagine the data stream consists of a series of alternating 1's and 0's much like a square wave. If the recovered clock is out of phase, then every recovered data bit will be wrong.

To properly recover the serial clock and data, the incoming data stream at line 138 is compared to the clock frequency 114 in a phase detector circuit 140. Phase detector circuits of various types are known in the prior art and therefore are not described here in detail. If a given transition or "edge" of the clock signal 114 is ahead of or "leads" a corresponding edge of the data stream at 138, the detector circuit 140 asserts the down "DOWN" output 142. This control signal is conveyed through muliplexer 126 to the charge pump 130 to affect a slight downward adjustment of the tune voltage at line 132 which, in turn, slightly lowers the frequency of the clock signal output by the VCO 112 to move into closer synchronization with the serial data stream. Conversely, when the clock signal 114 lags behind the data stream at 138, detector circuit 140 asserts the "UP" signal through MUX 126 to cause the charge pump to slightly increase the tune voltage applied to the VCO, and thereby slightly increase the frequency of its output. Thus, the first detector 122 can be considered a coarse adjustment of the VCO loop in order to drive the VCO to the right frequency, while the phase detector 140 adjusts the phase of the clock signal 114 so as to synchronize it to the incoming data stream. Since these two signals are synchronized, the clock signal 114 provides the recovered clock signal and the recovered clock signal is used to clock flip flop 150 to recover data from the incoming data stream.

Multiplexor 126 is arranged for controllably selecting as control inputs to the charge pump 130, one at a time of the frequency detector 122 and, alternatively, the phase detector 140, in response to the select control signal 144. Generally, while a serial data stream is being received, the clock signal 114 is at the correct frequency, i.e., the frequency of the serial data stream, and the multiplexor 126 is set to couple the output of phase detector 140 to the charge pump, in order to keep the recovered clock signal synchronized to the data stream. If and when synchronization is lost, the select input 144 to the multiplexor 126 switches so as to apply the detector 122 output to the charge pump to force the VCO to N times the reference frequency. Having done so, the multiplexor can then switch back to the phase detector 140 to again synchronize with the data. In other words, when synchronization is lost, the circuit falls back to the reference frequency, temporarily, preparatory to resynchronizing to the data.

During normal operation, the phase detector 140 compares transitions in the recovered clock signal 114 to transitions in the data signal 138 as described above. This recovery technique works adequately as long as there are sufficient transitions in the data. In other words, if the data signal goes for a long time, say 50 or 100 bit units, without any transition, the tuning signal Vtune drifts and consequently the recovered clock signal frequency and phase drifts as well. Various protocols are known for encoding serial data, prior to transmission, so as to ensure that transitions occur within some predetermined maximum number of bit units. However, these encoding schemes increase overhead, and reduce effective bandwidth, and, obviously, they impose constraints on the nature of the data.

In addition, the phase of the clock within the RECEIVE DATA signal can drift beyond the range within which the clock recovery circuit can accommodate the drift. If the clock in the device transmitting the RECEIVE DATA signal is slightly greater or lesser than the specified Reference Frequency $F_R \times N$, then the phase of the RECEIVE DATA signal will persistently lead or lag the RECOVERED CLOCK frequency causing the charge pump to attempt to keep moving Vtune. However, the tuning voltage Vtune has a limited range. Once the voltage level reaches a limit of the range of Vtune, it is no longer possible to adjust the output of VCO 112 in order to follow the drift in the clock within the RECEIVE DATA signal. This results in the loss of synchronization with the incoming RECEIVE DATA stream and, consequently, the loss of data.

Accordingly, a need remains for device which can continuously, i.e., without limiting adjust a phase of a recovered clock without the loss of received data.

SUMMARY OF THE INVENTION

It is, therefore, an object of the invention to provide a circuit and method which can continuously adjust for changes in the phase of a signal.

An embodiment of a continuously adjustable delay circuit according to the present invention includes a first variable delay path circuit which delays a clock signal by a first variable time interval that is inversely related to the control signal in order to generate a first delayed clock signal. Also included is a second variable delay path circuit which delays the clock signal by a second variable time interval that is directly related to the control signal in order to generate a second delayed clock signal, wherein the first and second variable time intervals have the same magnitude. A selector circuit is used to select one of the first and second delayed clock signals for output as a data clock signal.

An embodiment of a method for continuously adjusting a delay of a data clock signal involves delaying a reference clock signal by a first variable time interval that is inversely related to a control signal in order to produce a first delayed clock signal and delaying the reference clock signal by a second variable time interval that is directly related to the control signal in order to produce a second delayed clock signal. One of the first and second delayed clock signals is selected for output as a recovered data clock. And the delay control signal is obtained by comparing a phase of data transitions in a received data signal with a phase of clock edges in the recovered data clock to determine a phase difference and adjusting the control signal responsive to the phase difference.

Another embodiment of a continuously variable delay circuit according to the present invention includes a first delay circuit which delays a reference signal in direct relation to a tune signal, a second delay circuit which delays the reference signal in inverse proportion to the tune signal, a path selection circuit coupled to the output terminal of the first delay circuit and the output terminal of the second delay circuit and which generates a selection signal, and a first multiplexor which is coupled to the output terminals of the first and second delay circuits and which is controlled by the selection signal.

An advantage of the present invention is that it can continuously adjust the delay in a signal without being bound by limits on the range of a tuning signal.

The foregoing and other objects, features and advantages of the invention will become more readily apparent from the following detailed description of a preferred embodiment of the invention which proceeds with reference to the accompanying drawings.

DETAILED DESCRIPTION

Figure 3A:
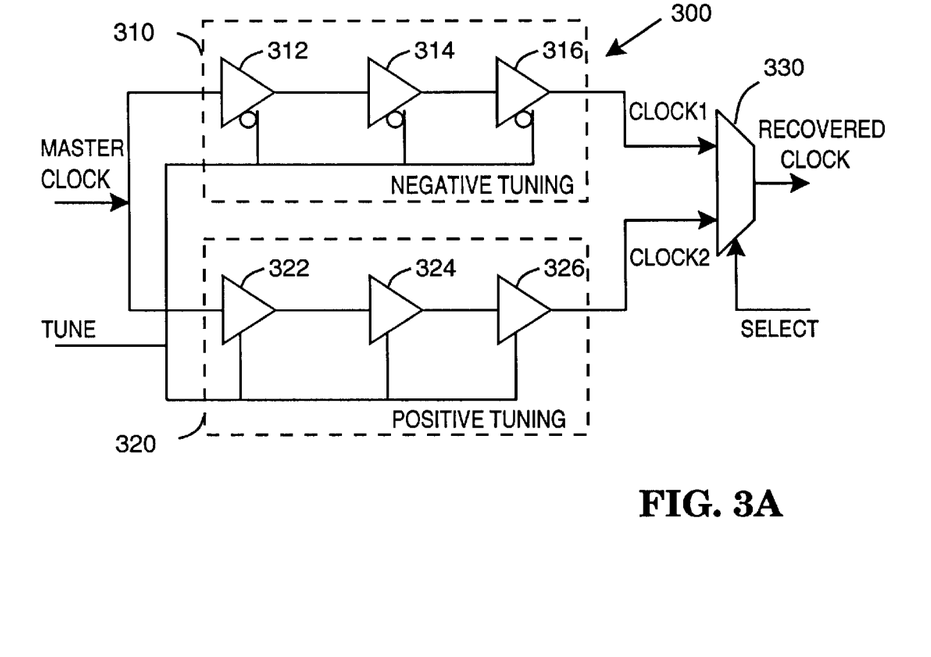
FIG. 3A is a functional block diagram of an embodiment of a continuously adjustable delay circuit according to the present invention.

Referring now to FIG. 3A, a continuously adjustable delay circuit 300 according to the present invention is shown. The present continuously adjustable delay circuit 300 is constructed using two variable delay paths 310 and 320. The first delay path 310 is composed of delay elements 312, 314 and 316, which respond inversely to a delay control signal TUNE in order to generate a first delayed clock signal CLOCK1. The second delay path 320 is composed of delay elements 322, 324 and 326, which respond in direct relation to the TUNE signal in order to generate a second delayed clock signal CLOCK2.

Figure 3B:
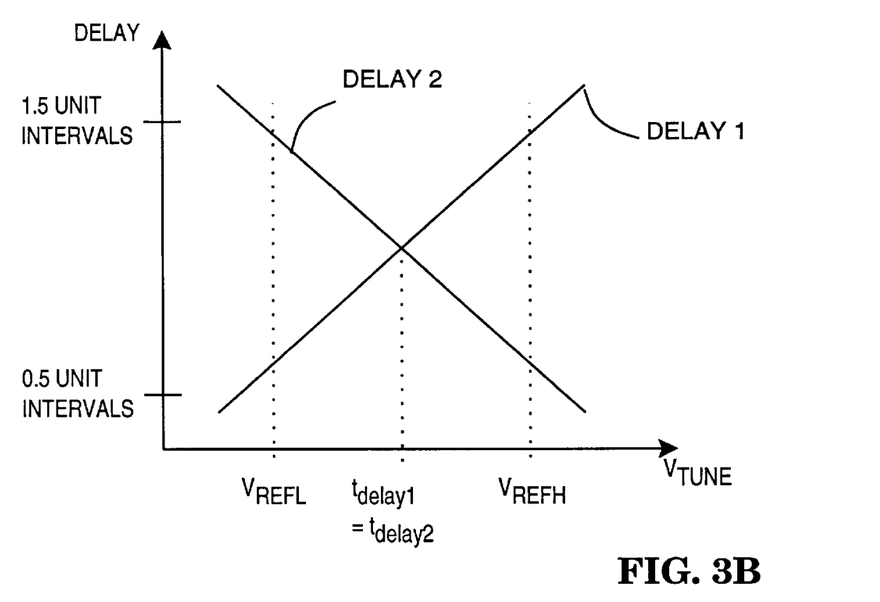
FIG. 3B is a plot of the relationship between the delay of each of the two delay paths of the continuously adjustable delay circuit of FIG. 3A and a tune control signal.

Delay paths 310 and 320 each receive a MASTER CLOCK signal which is delayed under the control of the TUNE signal to obtain CLOCK1 and CLOCK2 respectively. FIG. 3B demonstrates the relationship between the delay of CLOCK1 (DELAY1) and CLOCK2 (DELAY2) and the voltage $V_{TUNE}$ of the TUNE signal. Note that DELAY1 and DELAY2 are complementary to one another, i.e. when one path is adjusted to near its maximum delay, then the other path is set to near its minimum delay by the same value of $V_{TUNE}$.

In order to continue tuning the delay in the same direction, i.e. to continue slipping or advancing the clock signal, the clock signal must be switched between CLOCK1 and CLOCK2 at a point when difference between the delay of each delay path is equal to one bit period T, which can be represented by the expression $|t_{delay1}-t_{delay2}|=T$ or $\Delta t=T$. Switching between CLOCK1 and CLOCK2 is accomplished using multiplexor 330, which is driven by a SELECT signal, to select one of the CLOCK1 or CLOCK2 signals for output as the RECOVERED CLOCK Note here that although each of delay paths 310 and 320 is shown as consisting of three delay elements each, each data path can also be implemented in fewer, but larger, variable delay elements. However, the larger number of gradations of a larger variable delay element typically results in a degradation of the delayed signal. Therefore, a larger number of smaller variable delay elements are used which have smaller gradient levels and therefore introduce less clock signal distortion.

Figure 4:
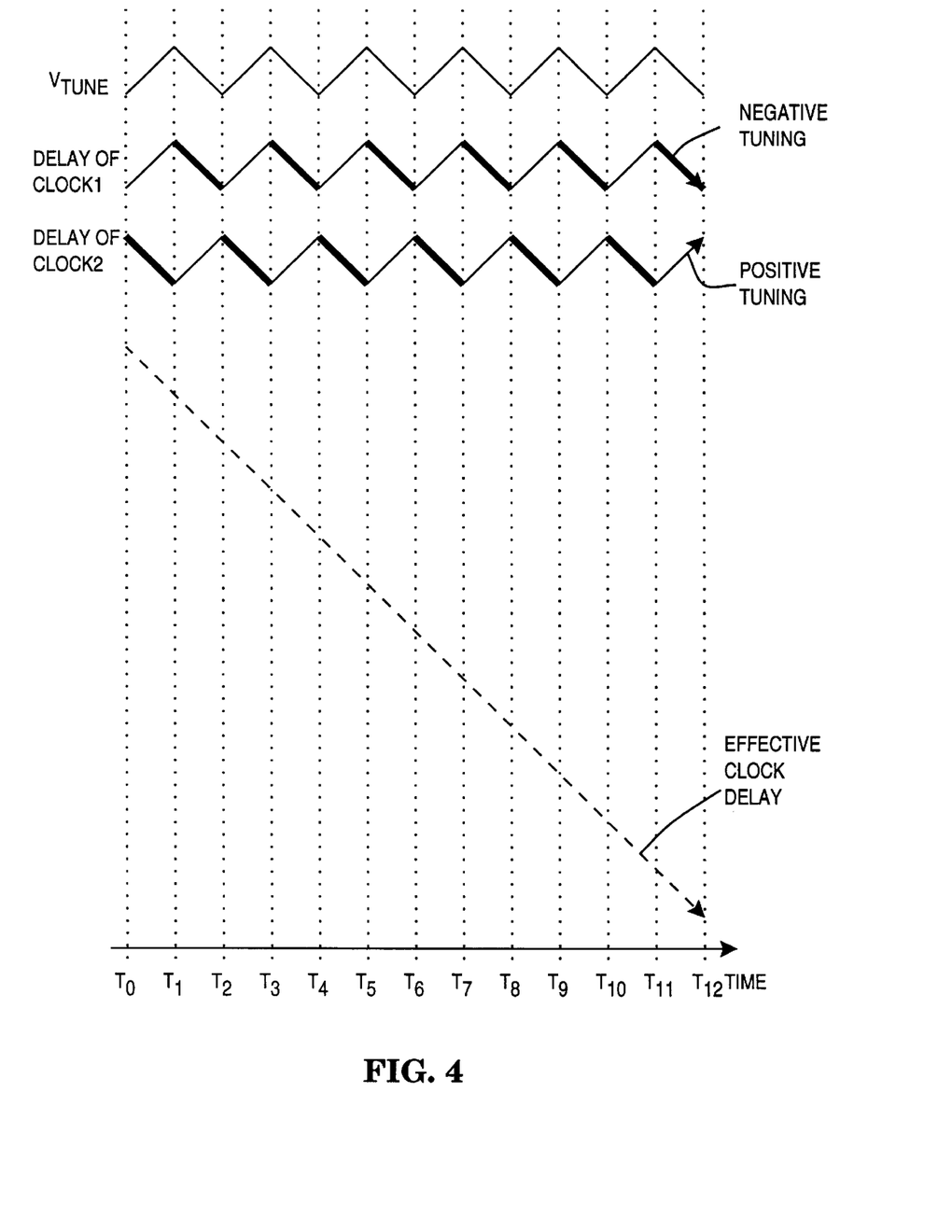
FIG. 4 is a time plot illustrating operation of the continuously adjustable delay feature of the continuously adjustable delay circuit of FIG. 3A.

FIG. 4 demonstrates the operation of the continuously variable delay 300 of FIG. 3A for the case of a continuously advancing data clock. The situation of a continuously advancing data clock arises when the data clock frequency of the received data is slightly higher than an ideal clock frequency, i.e. the transmit clock in the data transmitter is slightly higher than the operational frequency specified for the communications link. In this situation, the clock in the receiving device must be continuously advanced from the reference frequency (i.e. the master clock) in the receive device in order to compensate for the frequency difference of the transmitter clock.

In FIG. 4, CLOCK2 is initially selected as the data clock signal at $T_0$, as illustrated by the bolded portion of the DELAY OF CLOCK 2 graph, and the delay of CLOCK2 steadily decreases until $T_1$. At $T_1$, $\Delta t=T$, at which point CLOCK1 is selected as the data clock signal, as represented by the bolded portion of the DELAY OF CLOCK 1 graph, and the delay of CLOCK1 steadily decreases until $T_2$, when, once again, $\Delta t=T$ and CLOCK2 is selected as the data clock signal. This switching process can be continued indefinitely to produce continuous tuning and obtain an EFFECTIVE CLOCK DELAY which continuously decreases to advance the receive clock and accommodate the error in the transmit clock. Similarly, the process can be reversed to obtain a continuously increasing delay to accommodate a continuously slipping transmit clock.

Figure 5:
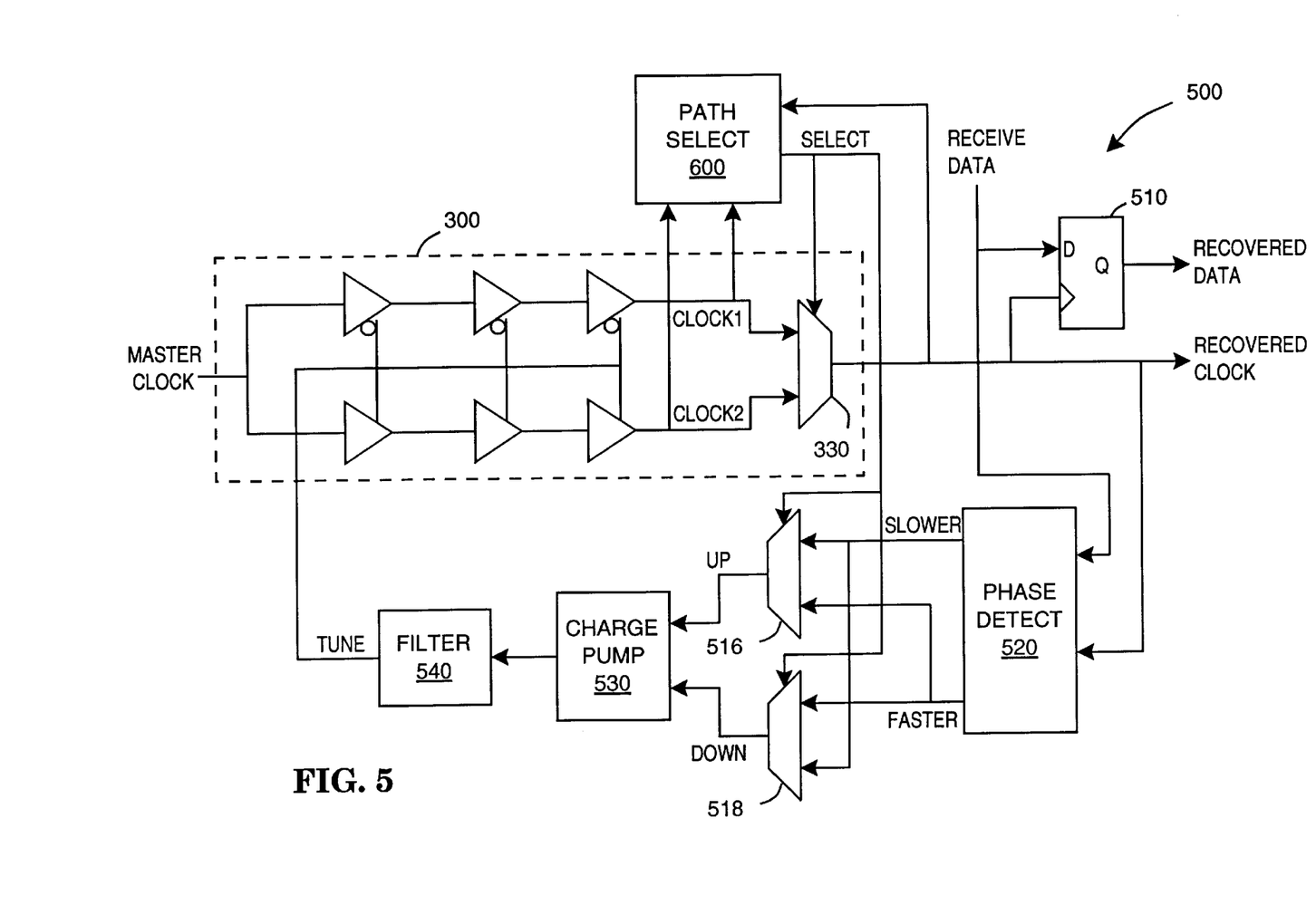
FIG. 5 is a functional block diagram of an embodiment of a data receiver incorporating the continuously adjustable delay circuit of FIG. 3A.

An embodiment of a receiver circuit 500 incorporating the continuously variable delay circuit 300 of FIG. 3A into a delay locked loop is shown in FIG. 5. PATH SELECT circuit 600 receives CLOCK1 and CLOCK2 from continuously variable delay 300, detects the condition $\Delta t=T$ and outputs the SELECT signal accordingly. The SELECT signal controls the selection of one of CLOCK1 and CLOCK2 by multiplexor (MUX) 330 as the RECOVERED CLOCK signal for receiver 500. The RECOVERED CLOCK drives flip flop 510, which is outside of the delay locked loop, to latch RECEIVE DATA and output the RECOVERED DATA signal.

The SELECT signal also controls MUXes 516 and 518 in order to coordinate the polarity of signals FASTER and SLOWER which are output by PHASE DETECT circuit 520 with the clock signal selected for output. Both RECEIVE DATA and RECOVERED CLOCK are input to PHASE DETECT circuit 520 which detects the phase difference between the RECOVERED CLOCK and the data transitions in RECEIVE DATA. Responsive to the phase difference, the PHASE DETECT circuit 520 generates the FASTER signal, if RECOVERED CLOCK lags the data transitions of RECEIVE DATA, or the SLOWER signal, if RECOVERED CLOCK leads the data transitions of RECEIVE DATA.

The FASTER and SLOWER signals are effectively the feedback of the delay locked loop formed with continuously variable delay 300. MUXes 516 and 518 coordinate the polarity of the feedback with the delay path of delay circuit 300 selected by path select circuit 600. MUX 516 selects the SLOWER signal for output as the UP signal when delay path 310 of FIG. 3A is selected and selects the FASTER signal for output as the UP signal when delay path 320 of FIG. 3A is selected. Similarly, MUX 518 selects the FASTER signal for output as the DOWN signal when delay path 310 is selected and selects the SLOWER signal for output as the DOWN signal when delay path 310 is selected.

The CHARGE PUMP 530 charges FILTER 540 responsive to the UP signal, which correspondingly increases VTUNE, and discharges FILTER 540 responsive to the DOWN signal, which correspondingly decreases $V_{TUNE}$. The output voltage VTUNE of FILTER 540 is the TUNE signal which controls continuously variable delay 300.

Figure 6A:
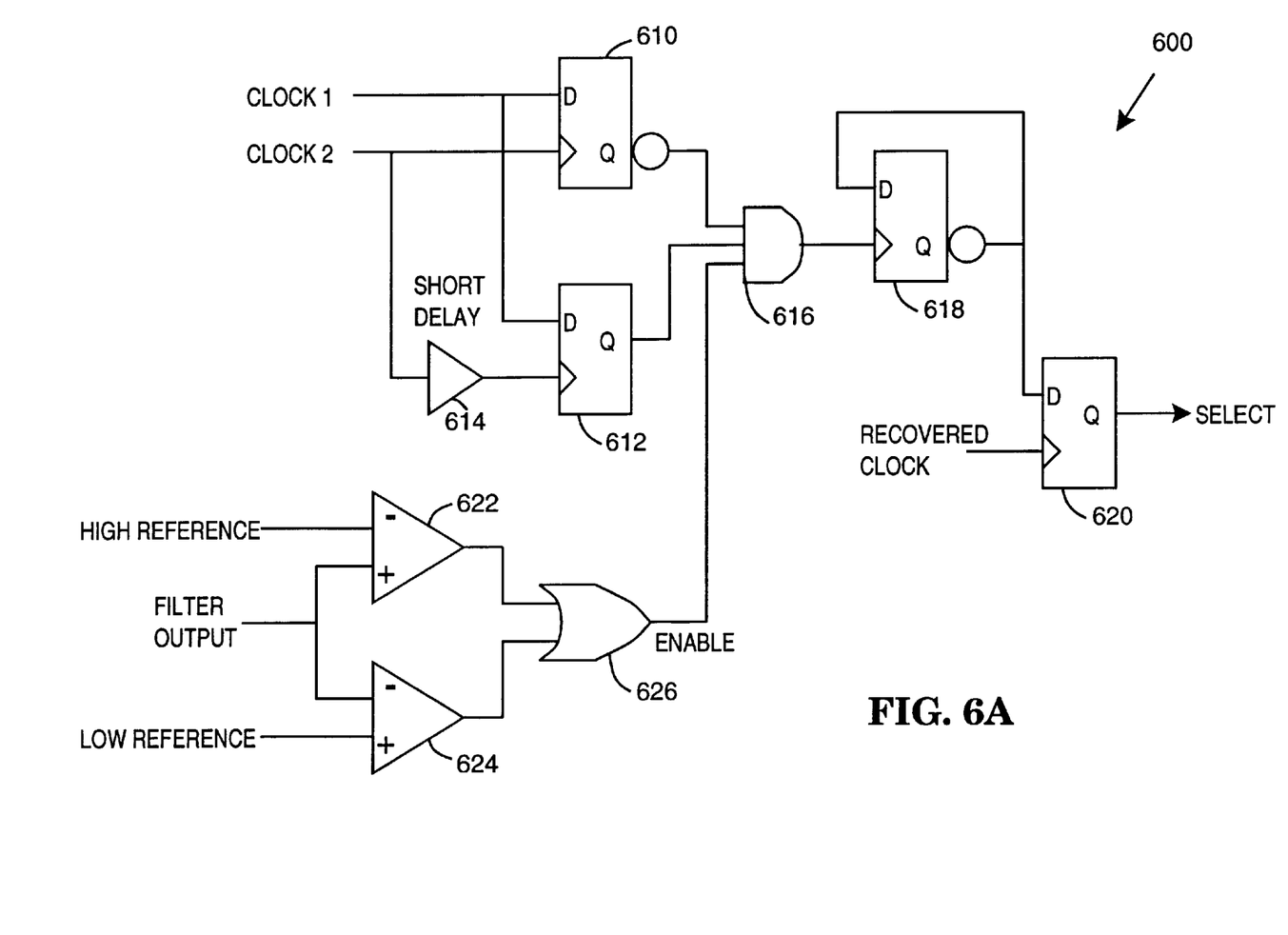
FIG. 6A is a logic diagram of an embodiment of the path select circuit of FIG. 5.

FIG. 6A shows an embodiment of the PATH SELECT circuit 600 of FIG. 5, which switches paths when the CLOCK1 and CLOCK2 signals are one bit period apart, and are therefore in-phase with one another. CLOCK1 is connected to the D input of flip-flops 610 and 612. CLOCK2 is directly connected to the clock input of flip-flop 610 and is connected to the clock input of flip-flop 612 through delay buffer 614, where delay buffer 614 provides hysteresis for the switchover function. An AND gate 616 has three inputs, where the first input is coupled to the inverted output of flip-flop 610, the second input is coupled to the non-inverting output of flip-flop 612, and the third input receives an ENABLE signal generated by OR gate 626.

The output of AND gate 616 drives the clock input of flip-flop 618 which has its inverting output terminal coupled to its input terminal to produce a T (toggle) flip-flop logical function which alternates the value of the output of flip-flop 618 each time the clock input is toggled. The inverting output of flip-flop 620 is then latched into flip-flop 620 by the RECOVERED CLOCK signal to align transitions in the SELECT signal, which appears at the non-inverting output of flip-flop 620, with the transitions of the RECOVERED CLOCK. Thus, switching between CLOCK1 and CLOCK2 occurs immediately after an active clock edge of the RECOVERED CLOCK and therefore accomplishes the clock switch without interruption of the RECOVERED CLOCK signal.

The ENABLE signal is obtained by comparing the FILTER OUTPUT ($V_{TUNE}$) to a HIGH REFERENCE, represented as $V_{REFH}$ in FIG. 3B, in comparator 622 and a LOW REFERENCE, represented as $V_{REFL}$ in FIG. 3B, in COMPARATOR 624 and ORing the result in OR gate 626. The ENABLE signal checks for the condition where the filter output is outside of the reference limits of the system to ensure that no switching takes place when $t_{delay1}=t_{delay2}$.

Figure 6B:
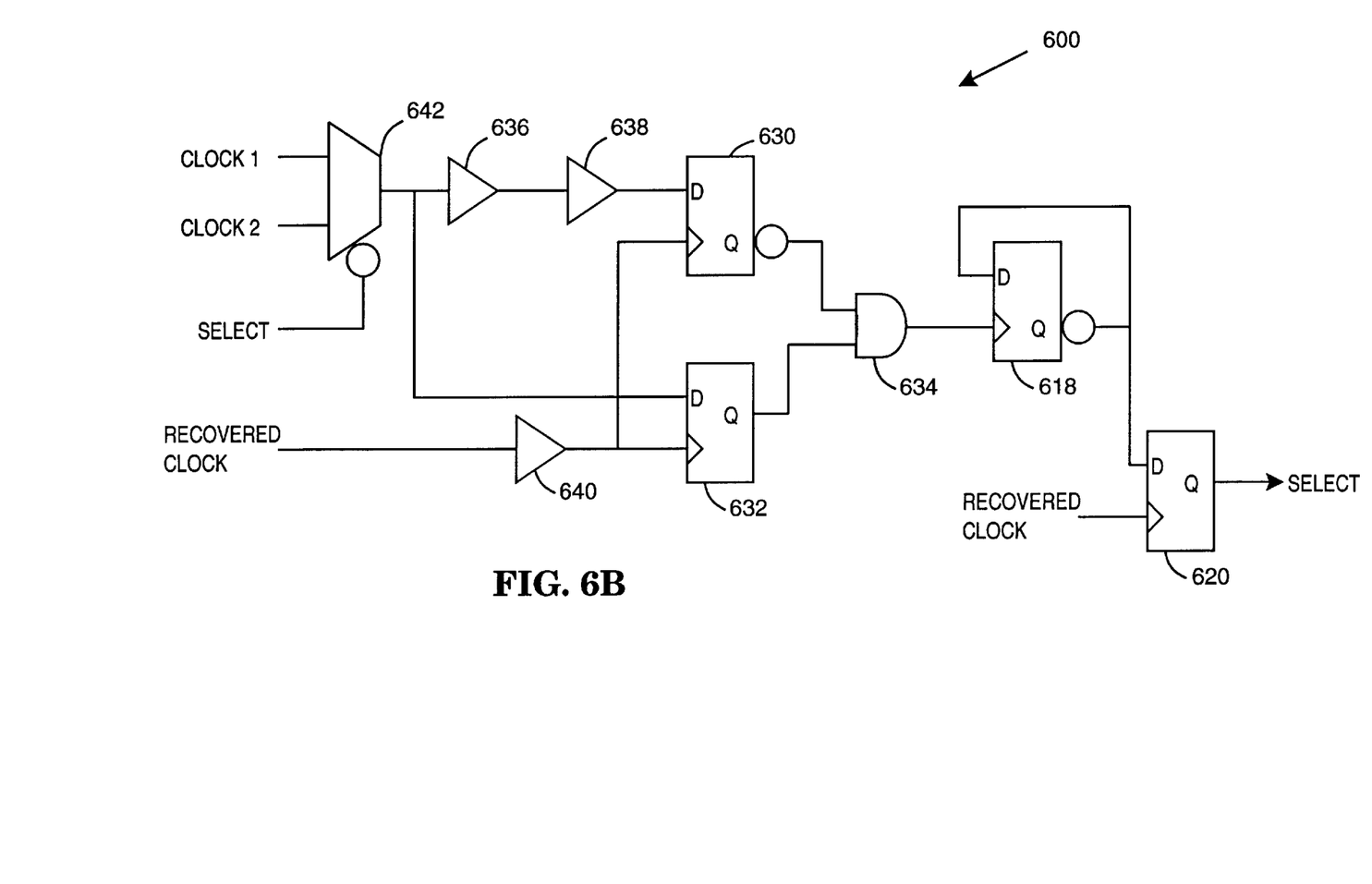
FIG. 6B is a logic diagram of another embodiment of the path select circuit of FIG. 5.

FIG. 6B shows another embodiment of the PATH SELECT circuit 600 of FIG. 5, which also switches delay paths when the CLOCK1 and CLOCK2 are separated by one bit period. CLOCK1 and CLOCK2 are input to MUX 642 which selects the opposite clock signal, responsive to the current value of the SELECT signal, from the clock signal selected as the RECOVERED CLOCK responsive to the current value of the SELECT signal. The opposite clock signal is then directly connected to the D input of flip-flop 632 and connected to the D input of flip-flop 630 through short delay buffers 636 and 638. RECOVERED CLOCK is connected to the clock inputs of flip-flops 630 and 632 through short delay buffer 640. Delay buffers 636, 638 and 640 introduce a short tolerance delay to accommodate the finite granularity of the delay paths 310 and 320 of FIG. 3A. The inverting output of flip-flop 630 and the non-inverting output of flip-flop 632 are input to AND gate 634 which produces the SELECT signal. The PATH SELECT circuit 600 of FIG. 6B will switch the state of the SELECT signal when the rising edge of RECOVERED CLOCK signal is between the rising edge of opposite clock signal less the delay of buffer 636 and the rising edge of opposite clock signal plus the delay of buffer 638.

Alternatively, the charge pump 530, filter 540 and TUNE signal of FIG. 5 can be replaced by up/down digital counters and digital-to-analog (D/A) converters to control current in the delay elements of continuously variable delay 300.

Figure 7:
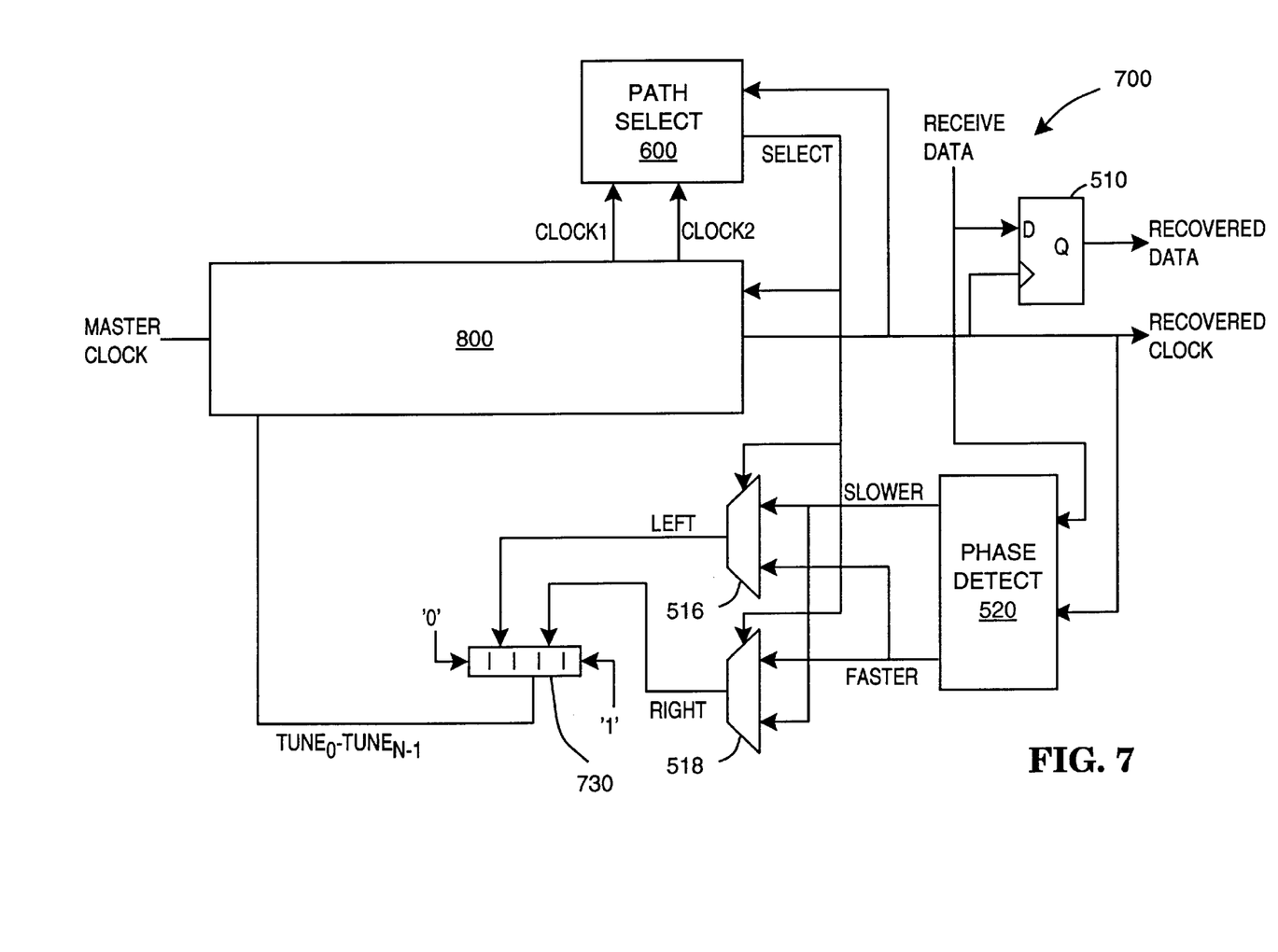
FIG. 7 is a functional block diagram of another data receiver incorporating the continuously adjustable delay circuit of FIG. 3A wherein the tune control signal is a digital value.

FIG. 7 shows a receiver 700 having a digitally-controlled, continuously variable delay 800. Charge pump 530 and filter 540 are replaced with a shift register 730 that fills with a logical '0' value from the most significant bit (MSB) direction and a logical '1' from the least significant bit (LSB) direction. The FASTER and SLOWER signals output from PHASE DETECTOR 520 are then coupled to the leftshift signal LEFT and rightshift signal RIGHT of shift register 730 through MUXes 516 and 518 in order to control the value stored in the shift register.

Figure 8:
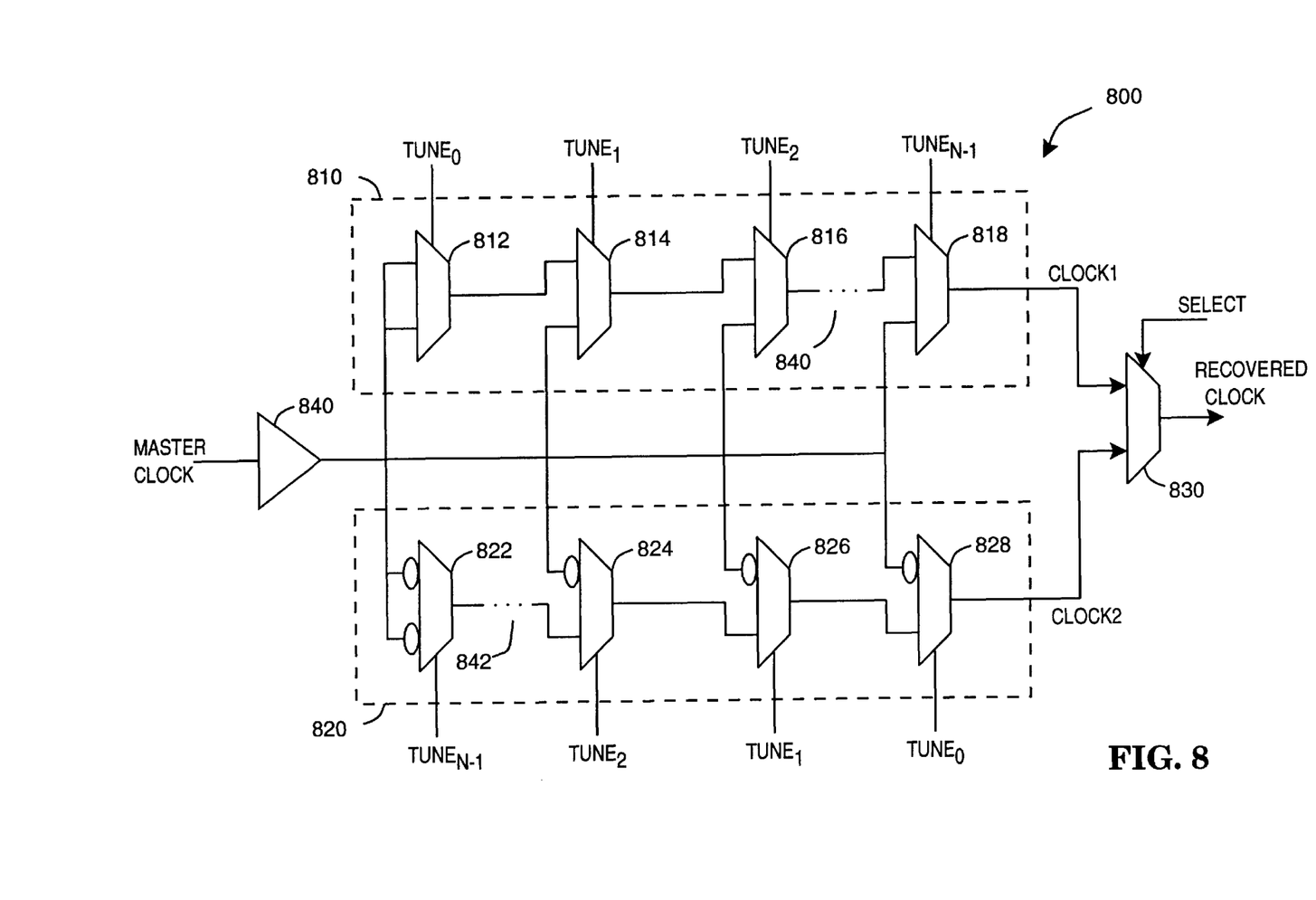
FIG. 8 is a functional block diagram of an embodiment of a digitally controlled continuously adjustable delay circuit suitable for use in the data receiver of FIG. 7.

A diagram of an embodiment of the digitally-controlled, continuously variable delay 800 is shown in FIG. 8. Clock delay path 810 is constructed from MUXes 812, 814, 816 and 818. Clock delay path 820 is constructed from MUXes 822, 824, 826 and 828. The MUXes act as the delay elements and the ellipses 840 and 842 indicate that the number of MUXes can be varied to match the delay needs of the particular application.

The MASTER CLOCK signal is buffered by driver 840 and input to both inputs of MUX 812, the first delay element in clock delay path 810, and MUX 822, the first delay element in clock delay path 820. Both inputs of MUX 822 are inverting inputs so as to invert the phase of the buffered MASTER CLOCK signal output from driver 830. The output of MUX 812 is input to a first input of MUX 814 while the second input of MUX 814 receives the buffered MASTER CLOCK signal. The output of MUX 822 is input to a non-inverting input of MUX 824 while an inverting input of MUX 824 receives the buffered MASTER CLOCK signal. Subsequent stages of each delay path are similarly connected. MUX 830, under the control of the SELECT signal, selects one of CLOCK1 and CLOCK2 for output as the RECOVERED CLOCK.

Note that, in addition to the buffered MASTER CLOCK signal being inverted in clock delay path 820, the $TUNE_0$-$TUNE_{N-1}$ control signals are connected to MUXes 822, 824, 826 and 828 in the reverse order from the way $TUNE_0$-$TUNE_{N-1}$ are connected to MUXes 812, 814, 816 and 818. This combination results in the variable time delays of clock delay path 810 and 820 being complementary with one another responsive to the same control inputs.

Using the example of N=4 in the context of shift register 730 of FIG. 7, an example of the digital logic progression in shift register 730 and digitally controlled continuously variable delay 800 is:

| MSB-LSB | DELAY1 | DELAY2 |
| --- | --- | --- |
| 0001 | lowest | highest |
| 0011 | | |
| 0111 | | |
| 1111 | highest | lowest |
| 0111 | | |
| 0011 | | |
| 0001 | lowest | highest |
| 0011 | | |
| 0111 | | |
| 1111 | highest | lowest |
| 0111 | | |
| 0011 | | |
| 0001 | lowest | highest | whereby the above sequence would accomplish a continuously increasing delay of the RECOVERED CLOCK signal. Note, however, that the switchover point may not be at the end points of the digital range but will take place at a point where the digital value corresponds to a phase overlap between CLOCK1 and CLOCK2.

Figure 9A:
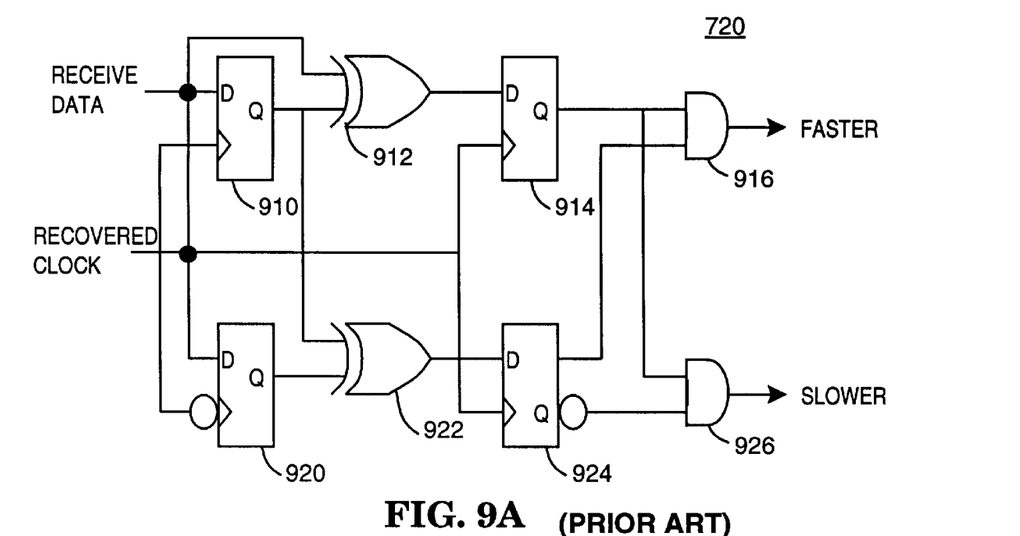
FIG. 9A is a logic diagram of an embodiment of the phase detector of FIGS. 5 and 7 according to the prior art.
Figure 9B:
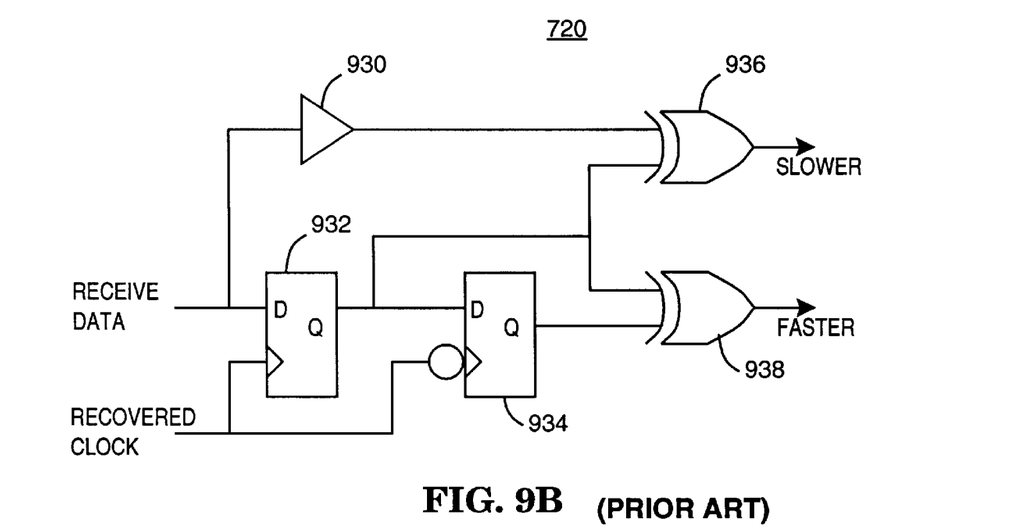
FIG. 9B is a logic diagram of another embodiment of the phase detector of FIGS. 5 and 7 according to the prior art.

FIGS. 9A and 9B illustrate embodiments of PHASE DETECTOR 520 of FIGS. 5 and 8. FIG. 9A shows a "bang-bang" phase detector which is well known in the art. An out of phase transition in RECEIVE DATA is clocked into flip-flop 910 by the RECOVERED CLOCK and results in the output of XOR gate 912 transitioning to a logical '1' that is clocked into flip flop 914 by the next cycle of the RECOVERED CLOCK and input into AND gates 916 and 926 to indicate that an out of phase condition exists. A determination of whether the clock lags or leads the data is made by comparing the state of the RECEIVE DATA clocked into flip-flop 910 at the rising edge of the RECOVERED CLOCK with the state of the RECEIVE DATA clocked into flip-flop 920 at the falling edge of the RECOVERED CLOCK in XOR gate 922. The result of the comparison in XOR gate 922 is clocked into flip-flop 924 by the next cycle of the RECOVERED CLOCK and the non-inverting output of flip-flop 924 is input to AND gate 916 while the inverting output is input to AND gate 926. If the phase of the RECOVERED CLOCK lags the phase of the RECEIVE DATA, then the FASTER signal output from AND gate 916 is active. If the phase of RECOVERED CLOCK leads the phase of the RECEIVE DATA, then the SLOWER signal output from AND gate 926 is active.

FIG. 9B shows a Hogge phase detector which is also well known in the art. A transition in RECEIVE DATA is clocked into flip-flop 932 by the RECOVERED CLOCK XOR gate 936 detects the phase difference between the RECEIVE DATA and the RECOVERED CLOCK signals and generates a variable width pulse as the SLOWER signal wherein the width of the pulse is proportional to the phase difference between the signals. Flip-flop 932 stores the state of the RECEIVE DATA at the previous rising edge of RECOVERED CLOCK for comparison to the state of RECEIVE DATA at the falling edge of the RECOVERED clock, captured by flip-flop 934. XOR gate 938 detects the difference in the RECEIVE DATA value between the two edges in order to determine whether the RECOVERED CLOCK lags the RECEIVE DATA and, in response, outputs a fixed length pulse as the FASTER signal.

Having described and illustrated the principles of the invention in a preferred embodiment thereof, it should be apparent that the invention can be modified in arrangement and detail without departing from such principles. For instance, though the present invention is described in the context of a delay-locked loop for recovering a received data clock, the continuously variable delay circuit and method of the present invention is applicable in other contexts where it is desireable to adjust the phase of a signal. We claim all modifications and variations coming within the spirit and scope of the following claims.

We claim:

1. A continuously adjustable delay-lock loop circuit, the circuit comprising:

a first variable delay path circuit having inputs to receive a clock signal and a delay control signal, for controllably delaying the clock signal by a first variable time interval that is inversely related to the delay control signal, in order to generate a first delayed clock signal;

a second variable delay path circuit having inputs to receive the clock signal and the delay control signal, wherein the second variable delay path is operable to delay the clock signal by a second variable time interval that is directly related to the delay control signal in order to generate a second delayed clock signal;

a path selector for selecting one at a time of the first and second delayed clock signals for output as a recovered clock signal; and a path selector circuit arranged so as to toggle between a first state selecting the first delayed clock signal as the recovered clock signal, and a second state selecting the second delayed clock signal as the recovered clock signal, when the first and second delayed clock signals are offset from each other by at least a predetermined phase difference approximately equal to one bit unit interval, thereby minimizing any discontinuity in the recovered clock signal.

2. A continuously adjustable delay circuit comprising:

a first adjustable means for delaying a master clock input signal responsive to a delay control signal to form a first delayed clock signal;

a second adjustable means for delaying the master clock input signal responsive to the delay control signal to form a second delayed clock signal; and means for selecting one at a time of the first and second delayed clock signals for output as a recovered clock signal, wherein the selecting means includes means for switching the selection as between the first and second delayed clock signals when the first and second delayed clock signals are substantially in phase with each other, thereby minimizing discontinuity in the recovered clock signal.

3. A continuously adjustable delay circuit according to claim 2 wherein the first and second adjustable means are complementary to one another such that one of the first and second adjustable means increases an amount of delay of the master clock signal responsive to the delay control signal while the other one of the adjustable means decreases an amount of delay of the master clock signal responsive to the delay control signal.

4. A continuously variable delay circuit, the circuit comprising:

a first delay circuit having input and output terminals and a control terminal, the input terminal of the first delay circuit being configured to receive a reference signal and wherein the first delay circuit is operable to delay the reference signal in direct relation to a tune signal received at the control terminal of the first delay circuit;

a second delay circuit having input and output terminals and a control terminal, the input terminal of the second delay circuit being configured to receive the reference signal and wherein the second delay circuit is operable to delay the reference signal in inverse relation to the tune signal received at the control terminal of the second delay circuit;

a path selection circuit having first and second input terminals and an output terminal, wherein the first input terminal of the path selection circuit is coupled to the output terminal of the first delay circuit and the second input terminal of the path selection circuit is coupled to the output terminal of the second delay circuit, the path selection circuit being operable to generate a selection signal at the output terminal of the path selection circuit, wherein the selection signal selects between the first and second delay circuits responsive to the delayed reference signal at the output terminal of the first delay circuit being in phase with the delayed reference signal at the output terminal of the second delay circuit; and a first multiplexor having first and second input terminals, a control terminal and an output terminal, wherein the first input terminal of the first multiplexor is coupled to the output terminal of the first delay circuit, the second input terminal of the first multiplexor is coupled to the output terminal of the second delay circuit and the control terminal of the first multiplexor is coupled to the output terminal of the path selection circuit.

5. The continuously variable delay circuit of claim 4, wherein:

the first delay circuit further comprises a first plurality of delay elements coupled in series between the input and output terminals of the first delay circuit, wherein each one of the first plurality of delay elements has input, output and control terminals, and wherein the control terminal of each one of the first plurality of delay elements is coupled to the control terminal of the first delay circuit; and the second delay circuit further comprises a second plurality of delay elements coupled in series between the input and output terminals of the second delay circuit, wherein each one of the second plurality of delay elements has input, output and control terminals, and wherein the control terminal of each one of the second plurality of delay elements is coupled to the control terminal of the second delay circuit.

6. The continuously variable delay circuit of claim 4, wherein the path selection circuit further comprises:

a first flip-flop having D input, clock input and inverting output terminals, wherein the D input terminal of the first flip-flop is coupled to the output terminal of the first delay circuit and the clock input terminal of the first flip-flop is coupled to the output of the second delay circuit;

a short delay element having input and output terminals, wherein the input terminal is coupled to the output of the second delay circuit;

a second flip-flop having D input, clock input and non-inverting output terminals, wherein the D input terminal of the second flip-flop is coupled to the output terminal of the first delay circuit and the clock input terminal of the second flip-flop is coupled to the output of the short delay element;

an AND logic gate having first, second and third input terminals and an output terminal, wherein the first input terminal is coupled to the inverting output of the first flip-flop and the second input terminal is coupled to the non-inverting output of the second flip-flop;

a third flip-flop having D input, clock input and inverting output terminals, wherein the D input terminal of the third flip-flop is coupled to the inverting output terminal of the third flip-flop and the clock input terminal of the third flip-flop is coupled to the output of the AND logic gate;

a fourth flip-flop having D input, clock input and non-inverting output terminals, wherein the D input terminal of the fourth flip-flop is coupled to the inverting output terminal of the third flip-flop, and further wherein the clock input terminal of the fourth flip-flop is coupled to the output terminal of the first multiplexor;

an OR logic gate having first and second input terminals and an output terminal, wherein the output terminal of the OR logic gate is coupled to the third input terminal of the AND logic gate;

a first comparator having inverting and non-inverting input terminals and an output terminal, wherein the inverting input terminal of the first comparator is configured to receive a first reference voltage, the non-inverting terminal of the first comparator is configured to receive the tune signal and the output terminal of the first comparator is coupled to the first input terminal of the OR logic gate; and a second comparator having inverting and non-inverting input terminals and an output terminal, wherein the inverting input terminal of the second comparator is configured to receive a second reference voltage, the non-inverting terminal of the second comparator is configured to receive the tune signal and the output terminal of the second comparator is coupled to the first input terminal of the OR logic gate.

7. The continuously variable delay circuit of claim 4, wherein the path selection circuit further comprises:

a second multiplexor having first and second input terminals, a control terminal and an output terminal, wherein the first terminal is coupled to the output terminal of the first delay circuit and the second terminal of the second multiplexor is coupled to the output terminal of the second delay circuit and the control terminal is coupled to the output terminal of the path selection circuit, and further wherein the control terminal of the second multiplexor is an inverting input such that the second multiplexor selects a different one of the first and second delay circuit outputs responsive a signal output by the path selection circuit than the first multiplexor;

a first short delay element having input and output terminals, wherein the input terminal is coupled to the output terminal of the second multiplexor;

a second short delay element having input and output terminals, wherein the input terminal is coupled to the output terminal of the first short delay element;

a third short delay element having input and output terminals, wherein the input terminal is coupled to the output terminal of the first multiplexor;

a first flip-flop having D input, clock input and inverting output terminals, wherein the D input terminal of the first flip-flop is coupled to the output terminal of the second short delay element and the clock input terminal of the first flip-flop is coupled to the output of the third short delay element;

a second flip-flop having D input, clock input and non-inverting output terminals, wherein the D input terminal of the second flip-flop is coupled to the output terminal of the second multiplexor and the clock input terminal of the second flip-flop is coupled to the output of the third short delay element;

an AND logic gate having first and second input terminals and an output terminal, wherein the first input terminal is coupled to the inverting output of the first flip-flop and the second input terminal is coupled to the non-inverting output of the second flip-flop;

a third flip-flop having D input, clock input and inverting output terminals, wherein the D input terminal of the third flip-flop is coupled to the inverting output terminal of the third flip-flop and the clock input terminal of the third flip-flop is coupled to the output of the AND logic gate; and a fourth flip-flop having D input, clock input and non-inverting output terminals, wherein the D input terminal of the fourth flip-flop is coupled to the inverting output terminal of the third flip-flop, and further wherein the clock input terminal of the fourth flip-flop is coupled to the output terminal of the first multiplexor.

8. The continuously variable delay circuit of claim 4, further including:

a first flip-flop having D input, clock input and output terminals, wherein the D input terminal of the first flip-flop is configured to receive a receive data signal and the clock input terminal of the first flip-flop is coupled to the output terminal of the first multiplexor;

a phase detector circuit having first and second input terminals, a lead output terminal and a lag output terminal, wherein the first input terminal is configured to receive the receive data signal, the second input terminal is coupled to the output terminal of the first multiplexor, and wherein the phase detector circuit is operable to generate a lead signal at the lead output terminal of the phase detector circuit responsive to a phase of the receive data signal leading a phase of a signal output from the first multiplexor and generate a lag signal at the lag output terminal of the phase detector circuit responsive to the phase of the receive data signal lagging the phase of the signal output from the first multiplexor;

a second multiplexor having first and second input terminals, a control terminal and an output terminal, wherein the first input terminal of the second multiplexor is coupled to the lead terminal of the phase detector circuit, the second input terminal of the second multiplexor is coupled to the lag terminal of the phase detector circuit and the control terminal of the second multiplexor is coupled to the output terminal of the path selection circuit;

a third multiplexor having first and second input terminals, a control terminal and an output terminal, wherein the first input terminal of the third multiplexor is coupled to the lag terminal of the phase detector circuit, the second input terminal of the third multiplexor is coupled to the lead terminal of the phase detector circuit and the control terminal of the third multiplexor is coupled to the output terminal of the path selection circuit; and a tune signal generator having first and second input terminals and an output terminal, wherein the first input terminal is coupled to the output of the second multiplexor and the second input terminal is coupled to the output terminal of the third multiplexor, and wherein the tune signal generator is further configured to generate the tune signal at the output terminal of the tune voltage generator, and wherein the tune signal generator is operable to increase the tune signal responsive to a signal output from the output terminal of the second multiplexor and decrease the tune signal responsive to a signal output from the output terminal of the third multiplexor.

9. A continuously variable delay circuit, the circuit comprising:

a first delay circuit having input and output terminals and a control terminal, the input terminal of the first delay circuit being configured to receive a reference signal and wherein the first delay circuit is operable to delay the reference signal in direct relation to a tune signal received at the control terminal of the first delay circuit;

a second delay circuit having input and output terminals and a control terminal, the input terminal of the second delay circuit being configured to receive the reference signal and wherein the second delay circuit is operable to delay the reference signal in inverse proportion to the tune signal received at the control terminal of the second delay circuit;

a path selection circuit having first, second and third input terminals and an output terminal, wherein the first input terminal of the path selection circuit is coupled to the output terminal of the first delay circuit and the second input terminal of the path selection circuit is coupled to the output terminal of the second delay circuit, the path selection circuit being operable to generate a selection signal at the output terminal of the path selection circuit; and a first multiplexor having first and second input terminals, a control terminal and an output terminal, wherein the first input terminal of the first multiplexor is coupled to the output terminal of the first delay circuit, the second input terminal of the first multiplexor is coupled to the output terminal of the second delay circuit and the control terminal of the first multiplexor is coupled to the output terminal of the path selection circuit and further wherein the output terminal of the first multiplexor is coupled to the third input terminal of the path selection circuit.

10. The continuously variable delay circuit of claim 9, wherein:

the first delay circuit further comprises a first plurality of delay elements coupled in series between the input and output terminals of the first delay circuit, wherein each one of the first plurality of delay elements has input, output and control terminals, and wherein the control terminal of each one of the first plurality of delay elements is coupled to the control terminal of the first delay circuit; and the second delay circuit further comprises a second plurality of delay elements coupled in series between the input and output terminals of the second delay circuit, wherein each one of the second plurality of delay elements has input, output and control terminals, and wherein the control terminal of each one of the second plurality of delay elements is coupled to the control terminal of the second delay circuit.

11. The continuously variable delay circuit of claim 9, wherein the path selection circuit further comprises:

a second multiplexor having first and second input terminals, an inverting control terminal and an output terminal, wherein the first input terminal of the second multiplexor is coupled to the first input terminal of the path selection circuit, the second input terminal of the second multiplexor is coupled to the second input terminal of the path selection circuit and the inverting control terminal is coupled to the control terminal of the path selection circuit;

a first short delay circuit having input and output terminals, where the input terminal of the first short delay circuit is coupled to the output terminal of the second multiplexor;

a first flip-flop having D input, clock input and non-inverting output terminals, wherein the D input terminal of the first flip-flop is coupled to the output terminal of second multiplexor;

a second short delay element having input and output terminals, wherein the input terminal is coupled to the third input terminal of the path selection circuit and the output terminal is coupled to the clock input of the first flip-flop;

a second flip-flop having D input, clock input and inverting output terminals, wherein the D input terminal of the second flip-flop is coupled to the output terminal of the first short delay circuit and the clock input terminal of the second flip-flop is coupled to the output of the second short delay element;

an AND logic gate having first and second input terminals and an output terminal, wherein the first terminal is coupled to the non-inverting output of the first flip-flop and the second input terminal is coupled to the inverting output of the second flip-flop;

a third flip-flop having D input, clock input and inverting output terminals, wherein the D input terminal of the third flip-flop is coupled to the inverting output terminal of the third flip-flop and the clock input terminal of the third flip-flop is coupled to the output of the AND logic gate; and a fourth flip-flop having D input, clock input and non-inverting output terminals, wherein the D input terminal of the fourth flip-flop is coupled to the inverting output terminal of the third flip-flop and the clock input terminal of the third flip-flop is coupled to the third input terminal of the path selection circuit and further wherein the non-inverting output terminal of the fourth flip-flop is coupled to the output terminal of the path selection circuit.

12. The continuously variable delay circuit of claim 9, further including:
- a first flip-flop having D input, clock input and output terminals, wherein the D input terminal of the first flip-flop is configured to receive a receive data signal and the clock input terminal of the first flip-flop is coupled to the output terminal of the first multiplexor;
- a phase detector circuit having first and second input terminals, a lead output terminal and a lag output terminal, wherein the first input terminal is configured to receive the receive data signal, the second input terminal is coupled to the output terminal of the first multiplexor, and wherein the phase detector circuit is operable to generate a lead signal at the lead output terminal of the phase detector circuit responsive to a phase of the receive data signal leading a phase of a signal output from the first multiplexor and generate a lag signal at the lag output terminal of the phase detector circuit responsive to the phase of the receive data signal lagging the phase of the signal output from the first multiplexor;
- a second multiplexor having first and second input terminals, a control terminal and an output terminal, wherein the first input terminal of the second multiplexor is coupled to the lead terminal of the phase detector circuit, the second input terminal of the second multiplexor is coupled to the lag terminal of the phase detector circuit and the control terminal of the second multiplexor is coupled to the output terminal of the path selection circuit;
- a third multiplexor having first and second input terminals, a control terminal and an output terminal, wherein first input terminal of the third multiplexor is coupled to the lag terminal of the phase detector circuit, the second input terminal of the third multiplexor is coupled to the lead terminal of the phase detector circuit and the control terminal of the third multiplexor is coupled to the output terminal of the path selection circuit; and
- a tune signal generator having first and second input terminals and an output terminal, wherein the first input terminal is coupled to the output of the second multiplexor and the second input terminal is coupled to the output terminal of the third multiplexor, and wherein the tune signal generator is further configured to generate the tune signal at the output terminal of the tune signal generator, and wherein the tune signal generator is operable to increase the tune signal responsive to a signal output from the output terminal of the second multiplexor and decrease the tune signal responsive to a signal output from the output terminal of the third multiplexor.

* * * * *